US009099384B2

(12) United States Patent
May et al.

(10) Patent No.: US 9,099,384 B2
(45) Date of Patent: Aug. 4, 2015

(54) CHARGE ORDERED VERTICAL TRANSISTORS

(71) Applicants: Drexel University, Philadelphia, PA (US); The Trustees of the University of Pennsylvania, Philadelphia, PA (US)

(72) Inventors: Steven May, Philadelphia, PA (US); Jonathan Spanier, Bala Cynwyd, PA (US); James Rondinelli, Philadelphia, PA (US); Mitra Taheri, Philadelphia, PA (US); Robert Charles Devlin, Abington, PA (US); Andrew Marshall Rappe, Penn Valley, PA (US)

(73) Assignees: Drexel University, Philadelphia, PA (US); The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 14/373,267

(22) PCT Filed: Feb. 15, 2013

(86) PCT No.: PCT/US2013/026279
§ 371 (c)(1),
(2) Date: Jul. 18, 2014

(87) PCT Pub. No.: WO2013/123287
PCT Pub. Date: Aug. 22, 2013

(65) Prior Publication Data
US 2015/0001537 A1    Jan. 1, 2015

Related U.S. Application Data

(60) Provisional application No. 61/599,108, filed on Feb. 15, 2012.

(51) Int. Cl.
*H01L 29/24*    (2006.01)
*H01L 49/00*    (2006.01)
(Continued)

(52) U.S. Cl.
CPC .......... *H01L 29/24* (2013.01); *H01L 29/66666* (2013.01); *H01L 29/7827* (2013.01); *H01L 49/003* (2013.01)

(58) Field of Classification Search
CPC .............. H01L 29/24; H01L 29/66666; H01L 29/7827
USPC .................................................. 257/43, 329
See application file for complete search history.

(56) References Cited

U.S. PATENT DOCUMENTS 5,238,912 A    8/1993    Hikami
6,631,057 B1   10/2003   Allenspach et al.
(Continued)

FOREIGN PATENT DOCUMENTS

KR    20100121942 A    11/2010

OTHER PUBLICATIONS

International Search Report and Written Opinion; Mailed Aug. 19, 2014 for related PCT Application No. PCT/US2013/026279.
(Continued)

*Primary Examiner* — Allan R Wilson
(74) *Attorney, Agent, or Firm* — Mendelsohn, Drucker & Dunleavy, P.C.

(57) ABSTRACT

A vertical charge ordered transistor is disclosed. A thin charge ordered layer is employed as a tunnel barrier between two electrodes. A gate-induced accumulation of charge destabilizes the charge ordered state around the circumference of the device, opening up a parallel ohmic conduction channel, which leads to an exponential increase in source-drain current. VCOT devices have the potential to exhibit very large on/off ratios, low off-state currents, and sub-threshold slopes below 60 mV/dec.

21 Claims, 3 Drawing Sheets (51) Int. Cl.
*H01L 29/66* (2006.01)
*H01L 29/78* (2006.01)

(56) References Cited

U.S. PATENT DOCUMENTS

| | | | |
|---|---|---|---|
| 6,858,551 | B1 | 2/2005 | Turkevich et al. |
| 7,130,212 | B2 * | 10/2006 | Bednorz et al. .............. 365/145 |
| 7,391,072 | B2 | 6/2008 | Forbes et al. |
| 7,723,714 | B2 * | 5/2010 | Karg et al. ........................ 257/3 |
| 2005/0019594 | A1 | 1/2005 | Hunt et al. |
| 2005/0285175 | A1 | 12/2005 | Cheng et al. |
| 2008/0182128 | A1 | 7/2008 | Boy et al. |
| 2008/0247215 | A1 * | 10/2008 | Ufert .............................. 365/148 |
| 2008/0272365 | A1 | 11/2008 | Shimizu et al. |
| 2009/0001337 | A1 * | 1/2009 | Furukawa et al. ................ 257/2 |
| 2009/0174428 | A1 * | 7/2009 | Karg et al. ...................... 326/38 |
| 2010/0163845 | A1 | 7/2010 | Goel et al. |
| 2010/0284883 | A1 | 11/2010 | Cohen et al. |

OTHER PUBLICATIONS

Zhao, T., et al., "Colossal Magnetoresistive Manganite-Based Ferroelectric Field-Effect Transistor on Si," Applied Physics Letters, vol. 84, No. 5, Feb. 2, 2004, pp. 750-752.

Ueno, K., et al., "Field-Effect Modulation of Transport Properties of Charge-Ordered $La_{1/3}Sr_{2/3}FeO_3$ Thin Films," Physical Review B, 2006, vol. 73, No. 16, pp. 165103-1 to 165103-5, Apr. 5, 2006.

Rondinelli, J., et al., "Substrate Coherency Driven Octahedral Rotations in Perovskite Oxide Films," Physical Review B, 2010, vol. 83, pp. 113402-1 to 113402-4, May 26, 2010.

* cited by examiner

CHARGE ORDERED VERTICAL TRANSISTORS

This invention was made with government support under Grant No. ONR-N00014-11-1-0664 awarded by the Office of Naval Research. The government has certain rights in the invention.

BACKGROUND OF THE INVENTION

1. Field of the Invention

The present invention is directed to the field of transistors. In particular, the present invention is directed to the field of vertical charge ordered transistors.

2. Description of the Related Technology

Complex oxide heterostructures have been identified as a potential material platform for the development of novel electronic devices based on properties present in oxides but absent in conventional semiconductors such as metal-insulator transitions, correlated electronic phenomena, and ferroelectricity. A central challenge, and promise, to the growing field of oxide electronics lies not in the reproduction of traditional semiconductor devices with new materials, but rather in the development of novel devices with different operational mechanisms and utilities. Examples of such devices include field effect transistors (FETs) with ferroelectric gate oxides, modulation-doped Mott FETs, and nanoscale FETs that can be written and erased with scanning probe techniques.

Charge ordering, exhibited by a variety of complex oxides, holds promise as the physical basis for electronics as the charge ordering transition is accommodated by an abrupt increase in resistivity, occurs at ultrafast time scales, opens up a gap in the density of states, and can be manipulated with relatively small magnetic and electric fields. Additionally, charge ordering is often only stable in narrow compositional windows that correspond to specific carrier concentrations, such as 0.5 or 0.33 free electrons or holes per unit cell.

In compounds with narrow phase stability or in materials near the vicinity of a charge ordered to metallic transition, one may expect the application of a gate bias that accumulates or depletes a large concentration of carriers to destabilize the charge ordered phase, triggering an electric-field controllable insulator-to-metal transition. Previous work has demonstrated gate bias-induced carrier modulations in complex oxide systems, including materials in the charge ordered phase.

Therefore there is a need in the field to effectively charge order material for forming transistors, and in particular vertical charge ordered transistors.

SUMMARY OF THE INVENTION

An object of the present invention may be a vertical charge order transistor.

Another object of the present invention may be a method of making a vertical charge ordered transistor.

An aspect of the present invention may be a vertical charge ordered transistor comprising: a charge ordered layer; a source layer located adjacent the charge ordered layer; a drain layer located adjacent the charge ordered layer; a gate located adjacent to at least one of the layers; and a source electrode located on the source layer and a drain electrode located on the drain layer.

Another aspect of the present invention may be a method of making a vertical charge ordered transistor comprising: forming a charge ordered layer using an adjacent structural imprinting layer; forming a source layer located adjacent the charge ordered layer; forming a drain layer located adjacent the charge ordered layer; forming a gate located adjacent to at least one of the layers; and placing a source electrode located on the source layer and a drain electrode located on the drain layer.

Still yet another aspect of the present invention may be a method of making a vertical charge ordered transistor comprising: forming a charge ordered layer using an adjacent structural imprinting layer; forming a source layer located adjacent the charge ordered layer; forming a drain layer located adjacent the charge ordered layer; forming a gate located adjacent to at least one of the layers; and placing a source electrode located on the source layer and a drain electrode located on the drain layer.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIGS. 2A and 2B are graphs showing the accumulated carrier concentration as a function of distance from the dielectric/charge order interface; FIG. 2B shows the calculated spatial distribution of the tunnel barrier height in the charge ordered layer.

DETAILED DESCRIPTION OF THE PREFERRED EMBODIMENT(S)

The present invention employs a method for enhancing charge ordering transition temperatures and other physical phenomena in materials, and in particular in ABO3 perovskite oxides through the use of an adjacent structural imprinting layer. The temperature of the charge ordering transition is strongly coupled to the magnitude of B—O—B bond angles in perovskites. These bond angles are determined by rotations of the BO6 octahedra. In bulk perovskites, the magnitude of the BO6 octahedral rotations is determined by the material composition (i.e. elements are on the A-site and B-site).

The magnitude of octahedral rotations is controlled in a material (X) by forming an interface with a thicker second material (Y). At the interface between X and Y, the octahedral rotations present in material Y will be transferred into material X, forcing X to take on the octahedral rotations present in material Y. The use of a structural imprinting layer will allow control of the octahedral rotations in the charge ordered layer independent of its composition. Therefore, composition and structure may be independently controlled to enhance charge ordering. The magnitude of octahedral rotations controls a wide range of material properties from optical to electrical to catalytic. Thus, the use of a structural imprinting layer to control octahedral rotations in an adjacent layer is not limited to applications involving charge ordering and may find a much broader use.

The use of a structural imprinting layer in order to charge order material may be used in the design and operating principles of a vertical charge ordering transistor. The proposed device may be a vertical transistor, in which an active trilayer containing the charge ordered channel layer is grown between source and drain contacts, patterned into a layered structure, such as a mesa, and conformally coated with a gate oxide and a side gate.

Field-effect biasing may be used to destabilize the charge ordered state via electrostatic fields or carrier doping, thereby producing an orders of magnitude change in the channel resistance. This device addresses a primary weakness of oxide electronics—low carrier mobilities at room temperature—by relying on tunneling as opposed to band transport through a channel layer. As the charge ordering phase transition is of purely electronic origin, occurring at sub-picosecond time scales, the device holds the promise of ultrafast operation. Additionally, charge ordering arises from interactions between nearest neighbor B-site cations. The local nature of these interactions should be conducive to scaling of the device down to the nanoscale regime. Thus, the proposed device of the present application offers feasible ultra high density with ultrafast control of electron conductivity. Variations of this device design would include horizontal transistors, the use of current pulses instead of a field-effect to induce the charge order/disorder transition, and sensors in which light or magnetic fields induce the charge order/disorder transition.

Charge ordering (CO) is a real space ordering of valence electrons driven by Coulombic electron-electron interactions. Charge ordering holds tremendous potential as a basis for electronic devices. The charge ordering transition from a disordered to ordered state is accompanied by an abrupt increase in resistivity; CO can be melted at ultrafast timescales; and only weak fields are needed to melt charge ordering, offering the promise of low power devices.

As discussed above, the present invention may employ a static imprinting layer adjacent to the CO material to engineer the atomic structure in the CO layer so that the CO layer is susceptible to electric-field control of the charge ordered phase transition at room temperature. By coupling an electronic and a structural phase transition, ultrafast conductivity changes is united with the temperature stability required for a real-world paradigm changes in electronics.

One promising approach is to utilize the abrupt and large response (electrical, magnetic, caloric, etc) associated with functional phase transitions as the basis for electronic devices. The $ABO_3$ perovskite oxides have been identified as a materials class with which to pursue this strategy, as they exhibit a wide range of functionalities (magnetism, ferroelectricity, correlated electron phenomena, charge ordering), the energetics of which are often in close competition with one another. Thus, it is possible to tune between different electronic phases using external fields or via changes to the A- and B-site cation composition. The functionality of these materials can be further enhanced through the formation of coherent heterostructures consisting of isostructural but chemically distinct layers, allowing oxides with different electronic and structural behavior to be brought together at an atomically abrupt, epitaxial interface. Additionally, perovskite oxides are anticipated to be highly scalable for nanoelectronics, as parts per million levels of doping are not required to tune their electronic properties, as in conventional semiconductors.

There are two dominant mechanisms for inducing phase transitions in perovskites; an electronic approach in which the carrier concentration on the B-site cation is changed or a structural approach in which changes to B—O—B bond angles and B—O bond lengths alter either the electronic bandwidth or the stability of polar distortions. In the latter case, the bond angles and lengths are determined by the magnitude of rotations and distortions of the corner sharing $BO_6$ octahedra.

Figure 1A:
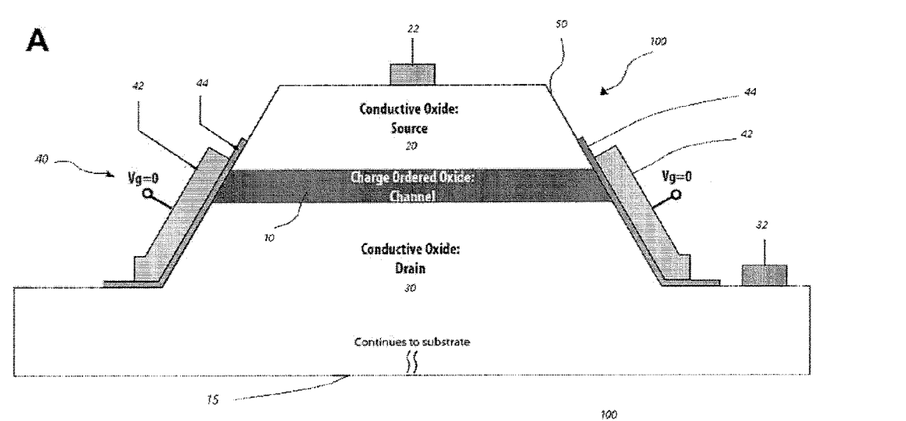
FIGS. 1A and 1B show schematics of the vertical charge order transistor in the off state (A) and on state (B).
Figure 1B:
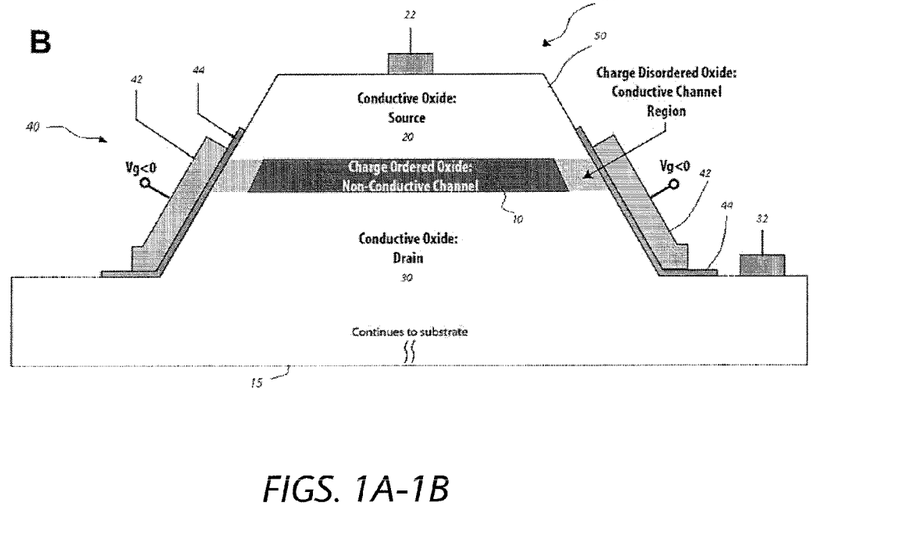

A method contemplated in the present invention is to use a structural imprinting layer to form the charge ordered layer. The charge ordered layer separating the source and drain contacts may then be manipulated with an external gate voltage. The proposed device may be that which is shown in FIGS. 1A and 1B, which is a vertical charge ordering transistor (VCOT) 100, discussed in detail below. In the VCOT 100 an active layered structure 50 containing the charge ordered layer 10 is grown between source layer 20 and drain layer 30, and in the embodiment shown herein, patterned into a mesa, and conformally coated with a gate 40. Field-effect biasing is used to destabilize the charge ordered state via electrostatic doping, thereby producing an orders of magnitude change in the channel resistance. Charge ordering will be stabilized via interfacial coupling of octahedral behavior between the channel layer 10 and adjacent structural imprinting layers. The use of the imprinting layers raises the structural phase transition temperature associated with rotations of the $BO_6$ octahedra allowing for control of the rotational magnitudes, which determines the electronic phase stability (charge ordered or disordered) of the channel layer. By coupling an electronic and a structural phase transition, ultrafast conductivity changes and the temperature stability required for a real-world paradigm change in electronics are united.

Shown schematically in FIG. 1A, the VCOT 100 comprises metallic source and drain electrodes 22, 32, and further may include insulating rotation imprinting layers (source layer 20 and drain layer 30), and a charge ordered layer 10. The drain electrode 32, imprinting layers, and charge ordered layer may all be perovskite oxide layers, grown epitaxially on a perovskite substrate 15 such as $SrTiO_3$.

Materials for suitable imprinting layers (source layer 20, drain layer 30), and charge ordered layer, may include $ReAlO_3$, $LaBO_3$, and $ReFeO_3$ (Re=rare earth ion, B=Ga, In, Lu) for the imprinting layers due to the large octahedral rotations found in these materials. $Re_{0.5}Sr_{0.5}MnO_3$ may be used for the charge ordered layer since manganites exhibit strong tendencies toward CO at half-doped conditions where the Mn cations can form a $Mn^{3+}/Mn^{4+}$ alternating pattern. Changes in carrier concentration that disrupt this 1:1 ratio of $Mn^{3+}/Mn^{4+}$ typically act to destabilize the charge ordered state. Electrostatic doping via field-effect gating may be used to induce the CO phase transition by altering the carrier concentration in the channel layer 10. Both perovskites and elemental metals may be employed as the source electrode 22. The compound that yields the lowest contact resistance is preferable. Both $LaNiO_3$ and $La_{0.7}Sr_{0.3}MnO_3$ may be used as a source electrode 22 and a drain electrodes 32, since these compounds exhibit metallic conductivity. These heterostructures will be patterned into layered structures 50, such as mesas and conformally coated with a gate dielectric 44, which in the embodiment shown may be $HfO_2$ and a split side gate electrode 42.

Between the metallic source electrode 22 and drain electrode 32 are the imprinting layers (source layer 20 and drain layer 30) and charge ordered layer 10, which are insulating in the off-state of the device. These insulating layers create a thick (≈4-8 nm) tunnel barrier, which may limit the device to very low current and leakage in the off-state. The modulation of channel current may be achieved through the manipulation of the charge ordering phase transition via a field-effect provided by the gate 40. The melting of charge ordering due to electrostatic doping reduces the tunnel barrier width from $(2d_I+d_{CO})$ to $(2d_I)$, where $d_I$ and $d_{CO}$ are the thicknesses of the imprinting and CO layers, producing large changes in conductance and a sizable on/off ratio due to the exponential dependence of tunneling current on barrier thickness. The effect of the gate bias is again noted and will alter the carrier concentration in the CO layer, thereby destabilizing the charge order. The gate bias will not alter the octahedral rotations since their centric nature prohibits coupling to an electric field.

This VCOT 100 addresses a primary weakness of oxide electronics, which is low carrier mobilities at room temperature by relying on tunneling as opposed to band transport through a channel layer. As the charge ordering phase transition is a purely electronic transition, occurring at femtosecond time scales, the device holds the promise of ultrafast operation. Additionally, charge ordering arises from interactions between nearest neighbor B-site cations. The local nature of these interactions should be conducive to scaling of the device down to the nanoscale regime. Thus, VCOT 100 offers feasible ultra-high-density with ultrafast control of electron conductivity.

An important aspect of the VCOT device 100 is that it is able to take advantage of the ability to induce a charge ordered state in a thin perovskite layer and to engineer the temperature $(T_{CO})$ associated with the CO transition to be above 300 K. To accomplish these goals, $T_{CO}$ is controlled by coupling to the structural phase of the adjacent rotation imprinting layers. To understand the approach, half-doped manganites exhibit either an insulating $Mn^{3+}/Mn^{4+}$ charge ordered state or a metallic ferromagnetic state depending on the average radii of the A-site cations. The reduction of the A-site cation size increases the magnitude of $MnO_6$ octahedral rotations, reducing electronic bandwidth. In bulk compounds (from which the phase diagram is derived), the sole mechanism for altering octahedral behavior is a change in composition. However, in epitaxial heterostructures octahedral behavior can be imprinted in adjacent materials due to interfacial coupling. In other words, octahedral behavior exhibits a proximity effect, extending beyond chemically abrupt heterointerfaces. In our heterostructures, the imprinting layers will be designed such that the octahedral rotations are large enough—i.e., the structural phase transition associated with the onset of rotations occurs at large enough temperatures—to impart the desired octahedral behavior to the channel layer and favor charge order over disorder. $T_{CO}$ and the abruptness of the resistivity change at the CO transition may possibly be tuned via the interfacial coupling of the electronic and structural phases in the channel and imprinting layers.

Candidate perovskite oxides for the "imprinting layer" are now discussed. The principal goal is to identify the optimal octahedral rotation pattern, with the largest magnitude rotations, that enhances the charge-ordered state in the "active" $(La,Sr)MnO_3$ layer. The preferred material properties for this layer describe how they will be computationally evaluated.

The preferred material should have suitable and robust octahedral rotations. The atomic structure of the perovskite imprinting layer should contain large (in amplitude) and the appropriate symmetry (in- or out-of-phase) octahedral rotations to enhance the CO susceptibility of the active layer. The preferred material should be Electrically inactive. The ideal imprinting layer is a robust (wide band gap) insulator throughout the device operating temperature range. This restriction enforces the VCOT 100 operation to be confined to the active layer and avoids waste current leakage. The preferred material should have rectifying heterointerfaces. The electronic properties of the imprinting layer/CO-active layer heterointerface should yield a Schottky barrier. This permits modulation of the carrier concentration of the CO layer through the application of an external bias.

Optimization of the magnitude of the tilt pattern of the materials may be performed as it has been established that large rotation angles enhance CO through electronic bandwidth narrowing. Because the particular influence of different rotational patterns, especially in the presence of coherent strain, could greatly modify the imprinting layer-supported charge-ordered state.

The imprinting layers are preferably structurally and electronically compatible with the active $(La,Sr)MnO_3$. Possible materials are insulating perovskite-structured imprinting layers that preserve the A-site cation sublattice throughout the heterostructure, i.e. La or Sr-containing oxides. Possible examples are trivalent La-based perovskite oxides $(LaBO_3)$, such as $LaGaO_3$, $LaInO_3$ and $LaLuO_3$. The merit of using La on the A-site is its electronic compatibility with the (La,Sr) $MnO_3$ active layer: Aside from the Sr dopants, the heterointerface is free from any polar discontinuity (and internal electrostatic fields).

Another possible material for use are Trivalent aluminates $(AAlO_3)$. Aluminate-based imprinting layers are preferred because $Al^{3+}$ cations ensure the electrical inertness of the imprinting layer. $LaAlO_3$ may be used by replacing La with smaller A-site cations, such as Sm, Gd, or Dy to enhance the magnitude of the octahedral rotations.

The choices for potential rotational imprinting perovskites may be broader than the lanthanum- and aluminate-based perovskites outlined above. In addition to the materials mentioned above, the Sr and divalent A-site oxide analogues, including B-site transition metals to the above materials (needed to avoid the polar catastrophe at SrO-terminated LSMO heterointerfaces), may be explored if our simulations indicate the La-based and aluminate perovskite oxides are unsuitable imprinting layers.

An important operating principle of the VCOT 100 relies on the imprinting layer transferring its octahedral rotation pattern (and symmetry cooperative distortions) into the active charge-ordering layer 10, placing the atomic structure of the active layer in close proximity to the functional charge-ordered state. Since the rigidity of the oxygen octahedral framework in the perovskite structure requires all octahedra in the same plane to rotate in opposite sense their cooperative nature suggests that octahedral rotations that are favored in one layer interact strongly with those in the adjacent layers. As a result, the octahedral rotations should significantly penetrate across the heterointerface. The penetration depth is important for the device operation; for example, the length scale over which the octahedral rotations propagate will in part determine the optimal device dimensions, namely the thickness ratio of the active layer to the imprinting layer.

Oxide molecular beam epitaxy (MBE) will be utilized to grow heterostructures consisting of material compositions and layer thicknesses identified using ab initio computational techniques. MBE is preferable for the work, as it does not rely on redepositing material from a target, as in sputtering or pulsed laser deposition. Therefore, MBE allows for films with differing compositions to be synthesized in a relatively short period of time. Additionally, the structural quality of oxide heterojunctions deposited by MBE rival or surpasses those deposited by other techniques. The precise control over layering and composition made possible with MBE growth is ideally-suited to collaborative efforts with theorists, as has been demonstrated in recent studies in which MBE was used to stabilize oxide compounds predicted by theorists to exhibit multiferroic properties.

While the underlying concepts were discussed above with respect to the VCOT 100, the operating principals of a VCOT 100 are described below. FIGS. 1A and 1B show an exemplary VCOT 100. In the VCOT 100, a thin charge ordered layer 10 is employed as a tunnel barrier between adjacent source layer 20 and drain layer 30 with metallic conductivity. A gate bias is used to trigger a charge order-to-disorder phase transition in the charge ordered layer 10 that operates as the barrier around the circumference of the layered structure 50. The gate bias-induced reduction and/or removal of the tunnel barrier formed by the charge ordered layer 10, opens up a parallel conduction path, through which an exponential increase in source-drain current can flow. The VCOT 100 offers the potential for high on/off ratios, very low sub-threshold currents, and large transconductance values.

The VCOT 100 structure is shown in FIG. 1. While the VCOT 100 described herein is employs an all-oxide device, the working principles may be transferable to other material platforms that exhibit charge-ordering behavior. The device consists of a layered structure 50, which is mesa shaped in the embodiment shown, containing a bottom conducting oxide layer that is the drain layer 30, a thin charge ordering layer 10, and a top conducting oxide layer that is the source layer 20.

The layered structure 50 is surrounded by a gate 40 formed by the gate dielectric 44 and gate electrode 42. The application of a positive bias between the gate 40 and drain layer 30 ($V_G$), leads to the accumulation of carriers in the charge ordered layer 10 at the interface with the gate dielectric 44. The addition of excess carriers destabilizes the charge ordering leading to a local phase transition from the ordered to the charge disordered state. With the melting of the charge ordered state around the mesa circumference, the tunnel barrier is also reduced or removed producing a parallel, low-resistance conduction path around the edge of the mesa.

Candidate material systems for the source layer 20 and drain layer 30 are $LaNiO_3$, $La_{2/3}Sr_{1/3}MnO_3$, and $SrRuO_3$. All of the aforementioned materials are oxides with metallic electronic behavior.

Charge ordering is found in a number of perovskite families including the manganites ($A_{n+1}Mn_nO_{3n+1}$), ferrites ($A_{n+1}Fe_nO_{3n+1}$), and nickelates ($A_{n+1}Ni_nO_{3n+1}$), where n=1, 2, or ∞ and A represents either a single cation or combinations of divalent and trivalent cations, such as $La_{1-x}Ca_x$. In the embodiment discussed above, $LaNiO_3$ is used to form the source layer 20 and drain layer 30. $HfO_x$ is used to form the gate dielectric 44. Al is used to form the gate electrode 42, and $La_{1/3}Sr_{2/3}FeO_3$ is used to form the charge ordered layer 10.

An example of the proposed source/channel/drain heterostructure—$LaNiO_3/La_{1/3}Sr_{2/3}FeO_3$ (9-12 unit cells)/$LaNiO_3$ (>30 unit cells)—can be synthesized using either oxide molecular beam epitaxy, pulsed laser deposition, or sputtering. Atomic layer deposition is one process that can be used to conformally coat the mesa heterostructure with $HfO_x$ and the gate metal.

In the example discussed above and used in the calculations presented here, the layered structure 50 has a diameter of 100 nm, the thickness of the gate dielectric 44 is 10 nm, and the operating temperature is 300 K. Optimization of the device may involve the selection of geometric parameters that include a range of mesa diameters from 10-2000 nm and concomitant thicknesses of the gate dielectric 44 from 2 to 50 nm.

In the off-state of the VCOT device 100 ($V_G=0$), the source-drain current ($I_{DS}$) is determined by the tunnel barrier height and width. $I_{DS}$ decreases exponentially with increasing barrier width, thus very low off-state currents can be achieved. Calculating the tunneling current using a rectangular barrier potential, values for the $I_{DS}$ are $4.9\times10^{-11}$ and $1.2\times10^{-13}$ A, assuming a source-drain voltage ($V_{DS}$) of 100 mV, a barrier height of 0.25 eV, and barrier widths (t) of 3.6 nm and 4.8 nm, respectively.

The application of a gate bias leads to a charge accumulation at the interface between the charge ordered layer 10 and the gate dielectric 44. The charge and potential as a function of distance are related via Poisson's equation; for the case of a cylindrical mesa this relation is given by:

$$\nabla_r^2 \psi = \frac{d^2\psi}{dr^2} + \frac{1}{r}\frac{d\psi}{dr} = \frac{kT}{q}\delta e^{\frac{q\psi}{kT}}, \quad (1)$$

with $\delta = q^2 n_i/kT\epsilon_r\epsilon_0$, where $\psi$ is the potential, $\epsilon_r$ is the relative dielectric constant of the charge ordered layer 10 (taken here to be 20), $\epsilon_0$ is the permittivity of free space, kT is the thermal voltage, $n_i$, is the intrinsic carrier concentration (assumed here to be $10^{19}$ cm$^{-3}$ in the charge ordered state), and q is the electron charge. The general solution for the potential from eqn (1) is:

$$\psi(r) = A - 2\ln(Br^2+1) \quad (2)$$

where A and B are constants determined from the boundary conditions that the derivative of the potential is zero at the center of the mesa and that the value of potential at the gate dielectric channel interface be equal to the surface potential, $\psi(r_0)=\psi_S$. This equation provides an expression for the potential as a function of radial distance into the charge-ordered oxide channel but requires the value of surface potential to be related to the applied gate voltage. To accomplish this, the charge on the gate electrode 42 is set equal to that at the channel-gate dielectric interface:

$$C_{ox}(V_{GS} - \Delta\phi - \psi_S) = \quad (3)$$

$$\varepsilon_r\varepsilon_0\frac{kT}{q}\sqrt{\frac{32}{t^2}\left(1 + \frac{1}{16}\delta t^2 e^{\frac{q\psi_S}{kT}} - \sqrt{1 + \frac{1}{8}\delta t^2 e^{\frac{q\psi_S}{kT}}}\right)},$$

where $C_{ox}$ is the oxide capacitance, $V_{GS}$ is the applied gate voltage, $\Delta\square$ is the gate metal-channel work function difference, $\psi_S$ is the surface potential and t is the thickness of the channel.[19] Solving for $\psi_S$ provides a relationship between the constant B and $\psi_S$:

$$e^{\frac{q\psi_S}{kT}} = -\frac{8B}{\delta(Br_0^2 + 1)^2}. \quad (4)$$

From this, the constant A can be found via:

$$A = \ln\left(-\frac{8B}{\delta}\right) \quad (5)$$

Note that the constant A sets the potential to an offset value at the center of the mesa. This pinning of the potential is a result of the surrounding-gate geometry but if the radius is large (approximately greater than 50 nm), this value goes to zero—i.e., the potential at the center of the mesa goes to zero as in the limiting case of single-gate transistors.

Once the potential ψ(r) is determined, the spatial dependence of the accumulated charge is then be solved from:

$$n = n_i e^{\frac{\psi_r}{kT}} \quad (6)$$

Figures 2A, 2B:
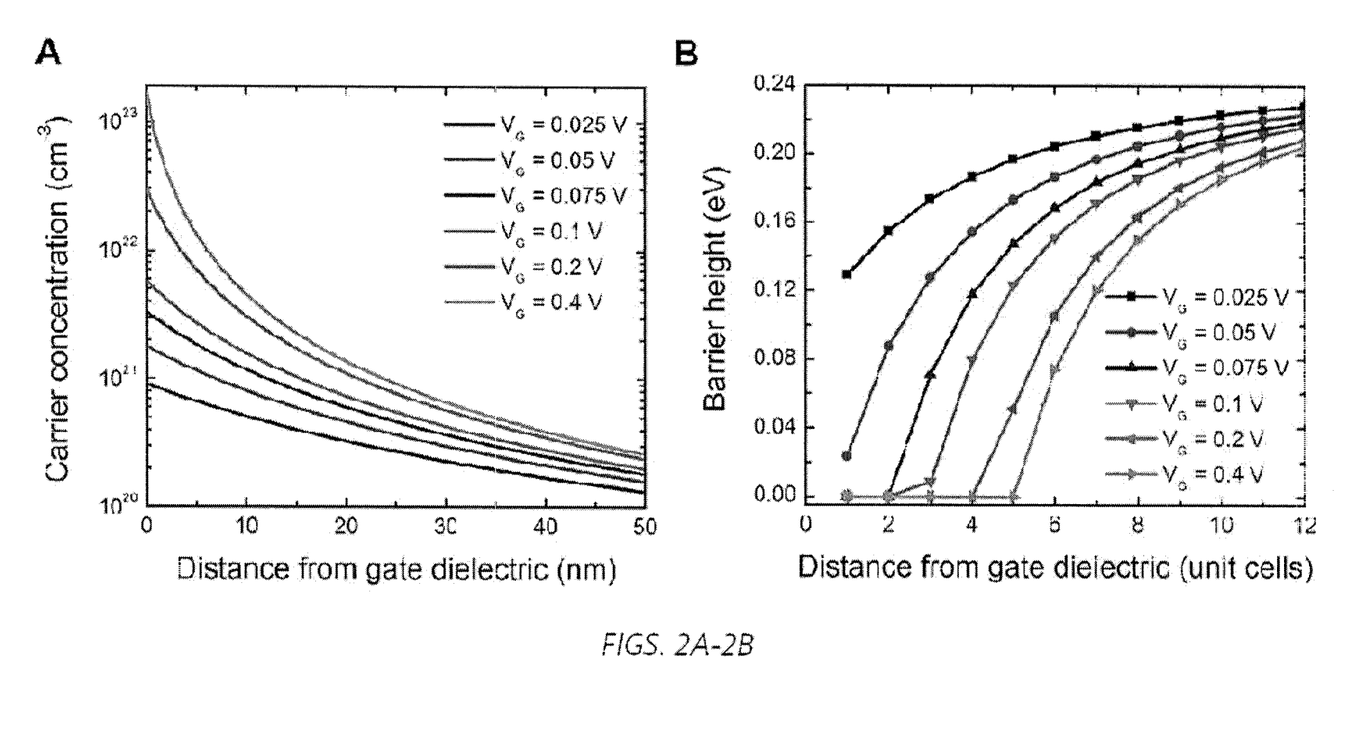
Figure 3A:
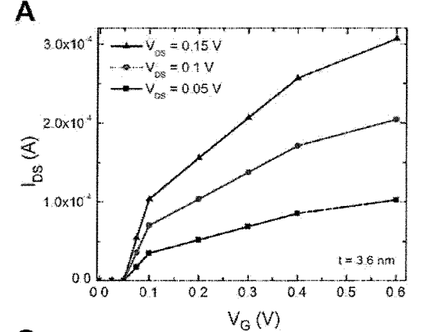
FIG. 3A shows the calculated transistor performance and source-drain current as a function of gate voltage for three different source-drain biases with a 3.6 nm barrier width on linear scale.
Figure 3B:
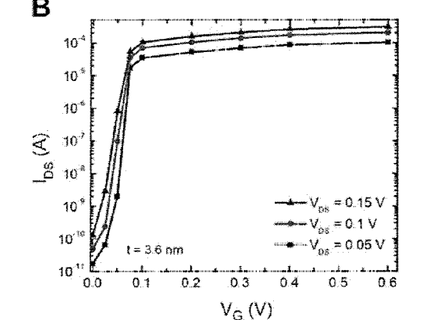
FIG. 3B shows the same data used in FIG. 3A plotted on a semilog scale.
Figure 3C:
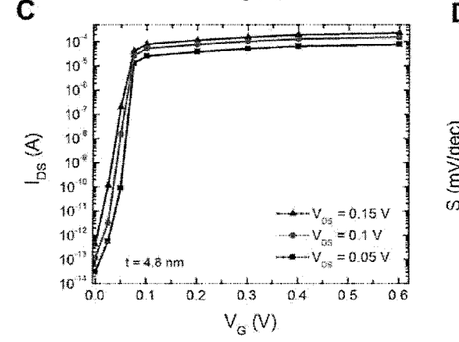
FIG. 3C shows the source-drain current as a function of gate voltage for a device with a 4.8 nm barrier width.
Figure 3D:
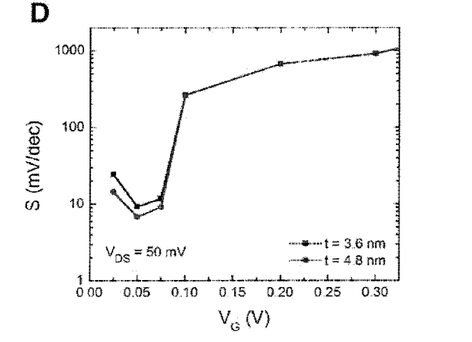
FIG. 3D shows the sub-threshold swing, $S=d\, V_G/d\, \log_{10}(I_{DS})$, presented as a function of gate bias.

FIG. 2A shows the calculated carrier concentration within the charge ordered layer 10 as a function of distance of the gate dielectric 44 for a variety of gate biases. The accumulated charge destabilizes the charge ordered phase reducing the tunnel barrier height, and above a critical carrier concentration removing the tunnel barrier. Here it is assumed that the charge order to disorder transition is complete, and therefore the tunnel barrier is removed, with the accumulation of 0.1 excess carriers per unit cell. For accumulated charge less than this critical value, the tunnel barrier is assumed to decrease in a linear manner with increasing accumulated carrier concentration. The barrier height in each unit cell near the gate dielectric/charge ordered layer interface is determined from integrating the accumulated charge profile shown in FIG. 2A over each unit cell to obtain the spatially resolved charge per unit cell. The obtained barrier height profiles are shown in FIG. 2B for a variety of gate biases.

The source-drain current as a function of gate bias is modeled by using a parallel resistor model, in which $I_{DS}$ is calculated for a series of parallel conduction channels. For the unit cells in which the tunnel barrier completely removed, the resistance is simply >t/A, where ρ is the resistivity of the material in the charge disordered state (here assumed to be 0.01 ^-cm), t is the channel length (same as the barrier width), and A is the area of the region over which the barrier is completely removed. For areas in which the barrier height is reduced but not removed, the resistance (R) is calculated from standard tunneling equations. Thus, the drain current can be solved by combining the resistors as:

$$R_{eq}^{-1} = \frac{1}{R_1} + \frac{1}{R_2} + \frac{1}{R_3} + \ldots + \frac{1}{R_n}, \quad (7)$$

with the value of resistances proceeding from the first unit cell at the channel-gate dielectric interface inward and the resistance $R_n$, being the bulk resistance of the channel with the unmodified tunnel barrier height and n being the number of unit cells that it takes for the barrier height to return to its original value. This model then allows the drain current to be found analytically using Ohm's law. Note that a rigorous description of the non-bulk-like transport characteristics of the charge ordered layer 10 within the nanoscale mesa may be necessary for a more precise model of the source-drain current as a function of gate bias, for instance to fully describe finite thicknesses effects in the melted portion of the charge ordered layer 10; such detailed modeling is beyond the state-of-the art. The device modeling approach utilized here captures the essential physics and performance metrics of the VCOT 100.

The results from this model are shown in FIG. 3. The source-drain current is found to increase exponentially for gate biases less than 0.1 V, resulting from a reduction and removal of the tunnel barrier around the mesas circumference with increasing gate bias. While the on-state current is set by the resistivity of the channel layer in its charge disordered state, very large on/off ratio can be achieved by choice of the barrier width, which controls the off-state current. For instance, on/off ratios of ~$10^7$ and $10^9$ are calculated for barrier widths of 3.6 and 4.8 nm. In addition to the excellent on/off ratios, the VCOT exhibits an extremely rapid increase in $I_{DS}$ as a function of $V_G$. This behavior can be quantified by calculating the subthreshold swing, S, defined as $S=dV_G/d\log_{10}(I_{DS})$. While the minimum possible value of S in conventional MOSFETs operating at room temperature is 60 mV/dec, values as small as 7 mV/dec are calculated for the VCOT in the gate bias regimes that trigger the charge order/disorder transitions. Such low values of S are a clear advantage of the VCOT 100 compared to existing transistors. In the modeled device, this minimum value of S occurs at $V_G$=0.05 V. For gate biases less than this, S begins to increase as not enough charge is accumulated to melt the tunnel barrier. For gate biases greater than this, S is orders of magnitude larger as $I_{DS}$ begins to saturate. The calculated S values are shown in FIG. 3D as a function of gate bias. A maximum transconductance ($=dI_{DS}/dV_G$) value of 2 mA/V was obtained near $V_G$=75 mV for the device with t=3.6 nm and $V_{DS}$=150 mV. Note that the calculations for accumulated charge represent the largest values that could be physically expected. In actual devices, defects would be expected to reduce the amount of free charge accumulated for a given gate bias. Therefore, it is anticipated that in working devices the minimum S values and device turn-on would occur at higher gate voltages, likely between 0.5 and 5 V.

The VCOT 100 has geometric similarities with semiconductor-based p-i-n vertical tunneling transistors, which also employ a gate wrapped around a mesa structure containing the channel (tunnel barrier) layer. While both devices are based on carriers tunneling through the channel layer and thus have very low sub-threshold currents, the operating principles are fundamentally different. In semiconductor vertical tunneling transistors, the gate voltage reduces the barrier width for carriers to tunnel between the valence band of the p-type layer and conduction band of the n-type layer. Thus, the on-state state current is limited by tunneling. In the VCOT 100, the introduction of carriers in the charge ordered channel modulates the phase of the material (removes the charge ordered state), causing an insulator to metal transition. Thus, the gate voltage acts to remove the tunnel barrier between two metallic electrodes, source electrode 22 and drain electrode 32.

The VCOT device 100 described herein will motivate further development of charge ordered oxides and heterostructures in which charge ordered materials are utilized as tunnel barriers. In particular, transport studies across heterojunctions of metallic oxides and charge ordered oxides are needed to obtain accurate values of tunnel barrier heights. Studies of gate-induced charge order/disorder phase transitions are needed to better understand how the band gap is reduced with the introduction of excess carriers. Additionally, the device 100 motivates the search of new charge ordered materials with large energy gaps.

In summary, the operating principles for a new electronic device in which a charge ordered compound is utilized as a tunnel barrier between metallic electrodes, source electrode 22 and drain electrode 32. The application of a gate bias destabilizes the charge ordered state, leading to a rapid increase in source-drain current. The main advantages of this VCOTT device 100 are a large on/off ratio, very low off-state currents, and sub-threshold slope values well below 60 mV/dec.

Charge ordering holds tremendous potential as a basis for electronic devices as the charge ordering transition from a disordered to ordered state is accompanied by an abrupt increase in resistivity; CO can be melted at ultrafast timescales; and only weak fields are needed to melt charge ordering, offering the promise of low power devices. The difference between the high and low resistance state offers a natural foundation for binary logic operations and data storage. Therefore, it is anticipated that charge ordering based transistors will be faster and operate at lower power than conventional silicon transistors.

The use of interfacial octahedral coupling to control bond angles in perovskites allows for both the structure of perovskites to be engineered independently of their cation composition. The ability to decouple structure and composition is not feasible in bulk compounds, in which octahedral behavior is determined by the material composition; therefore, the structural coupling of octahedral behavior offers a unique route to control the structure in complex oxides.

The VCOT 100 represents a new electronic device paradigm, impossible to replicate with silicon-based physics. The operating principles of the device lend themselves to scalability to nanometer sizes, with low operating voltages. While beyond the scope of the current proposal, the device may be made to exhibit non-volatile operation by replacing the $HfO_2$ gate dielectric with a ferroelectric oxide, which can be deposited using ALD. The demonstration of room temperature charge ordering in a device geometry could also be used as a basis for high precision magnetic field sensors, as magnetic fields are known to melt charge ordering. In such devices, the abrupt transition from an insulating to conducting state that accompanies the melting of charge ordering would be used to sense external fields. The high/low resistance state may also be used for memory devices. The wide range of applicability of these devices—logic, sensing, memory—could provide a novel platform in which a single device architecture is used for multiple ultrafast functions, providing the Navy with superior electronic capabilities over potential adversaries.

The advances made in the understanding of oxide heterostructure design, epitaxy, and characterization are likely to impact a range of technologies, not limited to electronics. Oxides are also used for transducers, energy conversion and storage devices, catalysis, and coatings. For all these applications, the ability to synthesize high quality oxide films with engineered surfaces is crucial to optimizing performance. Additionally, the next generation of technologies will rely on new materials, in particular heterojunctions or superlattices that combine multiple functionalities into a single structure. To realize such materials, it is crucial to understand the relationship between atomic and electronic structures to establish design criteria and the processes that occur in oxide film growth. By investigating structure/processing/properties relationships of the proposed materials, this project will advance the Navy's capabilities of fabricating novel functional oxide heterostructures.

An alternative embodiment may be a horizontal charge ordering transistor. This device will consist of the imprinting/CO/imprinting trilayer with source and drain electrodes contacting the CO layer but separated in the lateral direction. A dielectric oxide and a metal gate will be deposited between the source and drain electrodes. Geometrically similar to conventional FETs, this device will be used to study field-effect manipulation of charge ordering before moving on to the more technically challenging vertical geometry It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A vertical charge ordered transistor comprising:
    a charge ordered layer;
    a source layer located adjacent the charge ordered layer;
    a drain layer located adjacent the charge ordered layer;
    a gate located adjacent to at least one of the layers; and
    a source electrode located on the source layer and a drain electrode located on the drain layer.

2. The vertical charge ordered transistor of claim 1, wherein the gate comprises a gate electrode and a gate dielectric.

3. The vertical charge ordered transistor of claim 1, wherein the source layer is made from a perovskite material.

4. The vertical charge ordered transistor of claim 3, wherein the drain layer is made from a perovskite materials.

5. The vertical charge ordered transistor of claim 3 wherein the source layer material is selected from the group of materials consisting of $LaNiO_3$, $La_{2/3}Sr_{1/3}MnO_3$, and $SrRuO_3$.

6. The vertical charge ordered transistor of claim 5, wherein the drain layer material is selected from the group of materials consisting of $LaNiO_3$, $La_{2/3}Sr_{1/3}MnO_3$, and $SrRuO_3$.

7. The vertical charge ordered transistor of claim 1, wherein the charge ordered layer is made from $La_{1/3}Sr_{2/3}FeO_3$.

8. A method of making a vertical charge ordered transistor comprising:
    forming a charge ordered layer using an adjacent structural imprinting layer;
    forming a source layer located adjacent the charge ordered layer;
    forming a drain layer located adjacent the charge ordered layer;
    forming a gate located adjacent to at least one of the layers; and
    placing a source electrode located on the source layer and a drain electrode located on the drain layer.

9. The method of claim 8, wherein the gate comprises a gate electrode and a gate dielectric.

10. The method of claim 8, wherein the source layer is formed from a perovskite material.

11. The method of claim 10, wherein the drain layer is formed from a perovskite materials.

12. The method of claim 10, wherein the source layer material is formed from the group of materials consisting of $LaNiO_3$, $La_{2/3}Sr_{1/3}MnO_3$, and $SrRuO_3$.

13. The method of claim 11, wherein the drain layer material is formed from the group of materials consisting of $LaNiO_3$, $La_{2/3}Sr_{1/3}MnO_3$, and $SrRuO_3$.

14. The method of claim 8, wherein the charge ordered layer is made from $La_{1/3}Sr_{2/3}FeO_3$.

15. A vertical charge ordered transistor comprising:
    a charge ordered layer;
    a source layer located adjacent the charge ordered layer;
    a drain layer located adjacent the charge ordered layer;
    a gate located adjacent to at least one of the layers;
    a source electrode and a drain electrode; and
    wherein the source layer and the drain layer imprint the charge ordered layer.

16. The vertical charge ordered transistor of claim 15, wherein the gate comprises a gate electrode and a gate dielectric.

17. The vertical charge ordered transistor of claim 15, wherein the source layer is made from a peroskovite material.

18. The vertical charge ordered transistor of claim 17, wherein the drain layer is made from a peroskovite materials.

19. The vertical charge ordered transistor of claim 17, wherein the source layer material is selected from the group of materials consisting of $LaNiO_3$, $La_{2/3}Sr_{1/3}MnO_3$, and $SrRuO_3$.

20. The vertical charge ordered transistor of claim 19, wherein the drain layer material is selected from the group of materials consisting of $LaNiO_3$, $La_{2/3}Sr_{1/3}MnO_3$, and $SrRuO_3$.

21. The vertical charge ordered transistor of claim 15, wherein the charge ordered layer is made from $La_{1/3}Sr_{2/3}FeO_3$.

* * * * *